(12) United States Patent
Kudo et al.

(10) Patent No.: US 8,373,197 B2
(45) Date of Patent: Feb. 12, 2013

(54) CIRCUIT DEVICE

(75) Inventors: Kiyoaki Kudo, Moriguchi (JP); Takashi Shibasaki, Moriguchi (JP); Tetsuya Yamamoto, Hashima (JP)

(73) Assignees: SANYO Semiconductor Co., Ltd., Gunma (JP); Semiconductor Components Industries, LLC, Phoenix, AZ (US)

( * ) Notice: Subject to any disclaimer, the term of this patent is extended or adjusted under 35 U.S.C. 154(b) by 38 days.

(21) Appl. No.: 12/568,491

(22) Filed: Sep. 28, 2009

(65) Prior Publication Data

US 2010/0078675 A1 Apr. 1, 2010

(30) Foreign Application Priority Data

Sep. 29, 2008 (JP) ................................ 2008-250914

(51) Int. Cl.
| | |
|---|---|
| *H01L 29/74* | (2006.01) |
| *H01L 23/495* | (2006.01) |
| *H01L 23/10* | (2006.01) |
| *H01L 23/34* | (2006.01) |
| *H01L 29/66* | (2006.01) |

(52) U.S. Cl. ......... 257/140; 257/675; 257/706; 257/720
(58) Field of Classification Search .................. 257/140, 257/675, 676, 677, 718, 719, 720, 276, 625, 257/706, 707, 721, 722, 712–717, 796
See application file for complete search history.

(56) References Cited

U.S. PATENT DOCUMENTS

| | | | | |
|---|---|---|---|---|
| 6,559,536 | B1 * | 5/2003 | Katoh et al. .................. | 257/712 |
| 2004/0089925 | A1 * | 5/2004 | Fukuda et al. ................ | 257/676 |
| 2006/0120047 | A1 * | 6/2006 | Inoue ............................ | 361/699 |
| 2007/0085199 | A1 * | 4/2007 | Ong et al. ..................... | 257/720 |
| 2008/0067672 | A1 * | 3/2008 | Katoh et al. .................. | 257/712 |
| 2009/0309213 | A1 * | 12/2009 | Takahashi et al. ............ | 257/707 |

FOREIGN PATENT DOCUMENTS

JP 2007-036014 2/2007

* cited by examiner

*Primary Examiner* — Chuong A. Luu
(74) *Attorney, Agent, or Firm* — Morrison & Foerster LLP

(57) ABSTRACT

Provided is a circuit device having a configuration in which thermal interference between built-in elements is suppressed and being miniaturized in total size. A hybrid integrated circuit device of the present invention includes: a circuit substrate, a sealing resin and leads. The circuit substrate in its upper surface is incorporated with a hybrid integrated circuit formed of semiconductor elements and the like respectively fixed to heat spreaders. The sealing resin coats the circuit substrate and thus seals the hybrid integrated circuit. The leads each extend to the outside while being fixed to a pad formed of a conductive pattern. In this hybrid integrated circuit device, the semiconductor elements are mounted on the respective heat spreaders at positions offset from each other, and thereby are arranged to be spaced away from each other.

8 Claims, 5 Drawing Sheets

Q4 Q5 Q6
30D 30E 30F

CIRCUIT DEVICE

This application claims priority from Japanese Patent Application Number JP 2008-250914 filed on Sep. 29, 2008, the content of which is incorporated herein by reference in its entirety.

BACKGROUND OF THE INVENTION

1. Field of the Invention

The present invention relates to a circuit device, and particularly to a circuit device in which thermal interference between elements is suppressed.

2. Description of the Related Art

With reference to FIG. 5, a description will be given of a configuration of a hybrid integrated circuit device 100 as an example of a conventional circuit device. Firstly, a conductive pattern 103 is formed on a surface of a rectangular substrate 101 with an insulating layer 102 interposed therebetween. Circuit elements are fixed to desired portions of the conductive pattern 103, and thereby a predetermined electrical circuit is formed. Herein, a semiconductor element 105A and a chip element 105B are employed as the circuit elements. The semiconductor element 105A is, for example, a transistor or a diode. An upper-surface electrode of the semiconductor element 105A is connected to a predetermined part of the conductive pattern 103 through a metal wire 107. A back-surface electrode of the semiconductor element 105A is connected to a conductive pattern 103A. Meanwhile, the chip element 105B, which is a capacitor or a resistor, has, in its both ends, electrodes connected to the conductive pattern 103 through a bonding material 106 such as a solder. In addition, a sealing resin 108 has a function to seal the electrical circuit formed on the surface of the substrate 101.

On an upper surface of a hybrid integrated circuit with the above configuration, a circuit for switching a high current such as an inverter circuit is constructed, for example (see, Japanese Patent Application Publication No. 2007-036014).

However, when multiple power transistors are arranged in a small region for the purpose of miniaturization of the entire device incorporating, for example, an inverter circuit, these transistors thermally interfere with each other, and thereby cause a problem that the junction temperature thereof becomes higher than the temperature caused by self-heating.

In contrast, when transistors are arranged to be spaced apart from each other in order to avoid the above problem, another problem arises that miniaturization of the device in total size cannot be achieved even though thermal interference is suppressed.

The present invention has been made in view of these problems, and a main object of the present invention is to provide a circuit device having a configuration in which thermal interference between built-in elements is suppressed, and being miniaturized in total size.

SUMMARY OF THE INVENTION

A circuit device of the present invention includes: a circuit substrate; a first heat spreader arranged on an upper surface of the circuit substrate; a first semiconductor element fixed to an upper surface of the first heat spreader; a second heat spreader arranged, close to the first heat spreader, on the upper surface of the circuit substrate; and a second semiconductor element fixed to an upper surface of the second heat spreader. In the circuit device, a part of the upper surface of the first heat spreader to which the first semiconductor element is fixed is offset from a part of the upper surface of the second heat spreader to which the second semiconductor element is fixed.

According to the present invention, when semiconductor elements fixed to heat spreaders are arranged close to each other, the semiconductor elements are mounted on upper surfaces of the heat spreaders at positions offset from each other. Accordingly, the semiconductor elements fixed to the respective upper surfaces of the heat spreaders arranged close to each other can be spaced apart from one another as far as possible. Hence, thermal interference is suppressed and thus overheating of the semiconductor elements is suppressed.

BRIEF DESCRIPTION OF THE DRAWINGS

FIG. 1A is a perspective view thereof; FIG. 1B is a cross-sectional view thereof; and FIG. 1C is an enlarged cross-sectional view thereof.

FIGS. 2A and 2B are plan views for illustrating arrangements of heat spreaders and semiconductor elements; and FIG. 2C is a cross-sectional view for illustrating a configuration of thermal insulation.

FIG. 4A is a plan view thereof; and FIG. 4B is a cross-sectional view thereof.

DESCRIPTION OF THE INVENTION

Figure 1A:
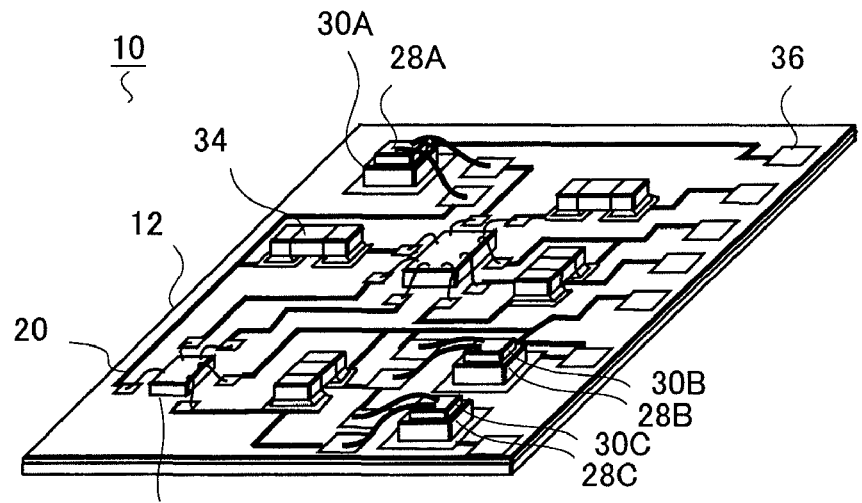
FIGS. 1A to 1C are views for illustrating a circuit device of the present invention.
Figure 1B:
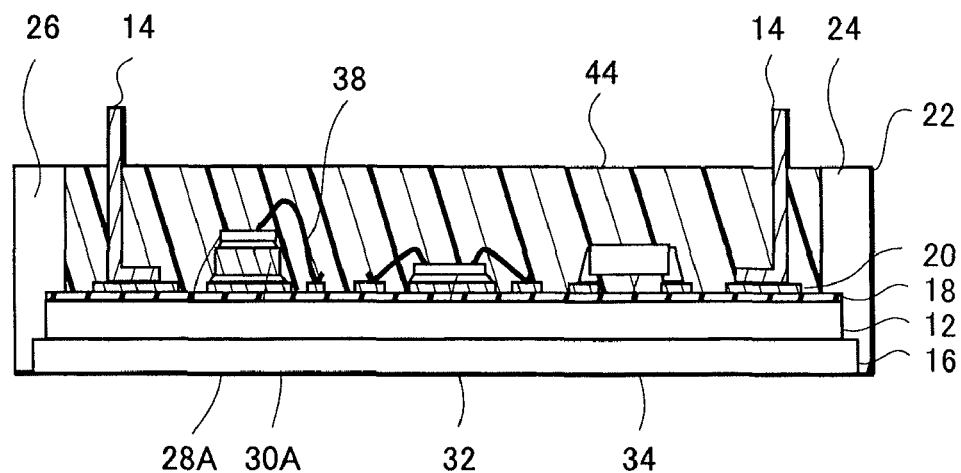
Figure 1C:
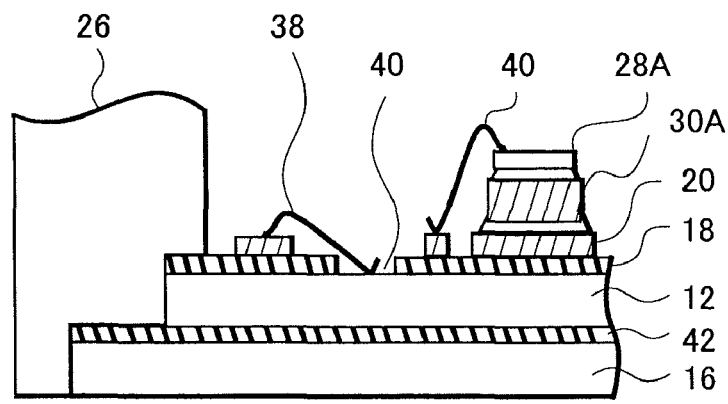

With reference to FIGS. 1A to 1C, a description will be given of a configuration of a hybrid integrated circuit device 10 as an example of a circuit device of the present invention. FIG. 1A is a perspective view for illustrating the hybrid integrated circuit device 10; FIG. 1B is a representative cross-sectional view of the hybrid integrated circuit device 10; and FIG. 1C is an enlarged cross-sectional view thereof.

As shown in FIGS. 1A and 1B, the hybrid integrated circuit device 10 mainly includes: a circuit substrate 12 incorporated with a hybrid integrated circuit in its upper surface; a sealing resin 44 for sealing the hybrid integrated circuit by coating the circuit substrate 12; and leads 14 extending to the outside while being fixed to pads formed of the conductive pattern 20. Here, the hybrid integrated circuit is formed of a conductive pattern 20, and semiconductor elements 28A and so on (circuit elements).

The circuit substrate 12 is a metal substrate mainly containing a material such as aluminum (Al) or copper (Cu). The specific size of the circuit substrate 12 is, for example, approximately 61 mm in length, 88 mm in width, and 1.5 mm to 2.0 mm in thickness. When a substrate made of aluminum is employed as the circuit substrate 12, both main surfaces of the circuit substrate 12 are coated with anodic oxide films. Here, the circuit substrate 12 may be made of an insulating material such as a resin material or an inorganic material represented by a ceramic material.

An insulating layer 18 is formed to cover the entire upper surface of the circuit substrate 12. The insulating layer 18 is made of an epoxy resin or the like highly-filled with, for example, about 60 weight percent to 80 weight percent of a filler such as $AL_2O_3$. Being made of the resin filled with the filler, the insulating layer 18 has such low thermal resistance that heat generated from built-in elements can be well discharged to the outside through the insulating layer 18 and the circuit substrate 12. The specific thickness of the insulating layer 18 is about 50 μm, for example.

The conductive pattern 20 is made of a metal such as copper having a thickness of about 35 μm to 70 μm, for example, and is formed on a surface of the insulating layer 18 so that a predetermined electrical circuit can be formed thereon. In addition, pads formed of the conductive pattern 20 are provided at portions to which the leads 14 are fixed.

Any active element or any passive element may generally be employed as a circuit element electrically connected to the conductive pattern 20. Specifically, a transistor, an LSI chip, a diode, a chip resistance, a chip capacitor, an inductance, a thermistor, an antenna, an oscillator or the like may be employed as the circuit element. As shown in FIG. 1A, the semiconductor element 28A, a control element 32 that is an LSI, a chip element 34 that is a chip resistance, a chip capacitor and the like are mounted on the upper surface of the circuit substrate 12, and are connected to the conductive pattern 20.

In this embodiment, the semiconductor element 28A or the like having high calorific power is mounted on an upper surface of a heat spreader 30A made of a metal piece, such as copper, with excellent thermal conductivity. More specifically, the heat spreader 30A is mounted on an upper surface of the pad formed of the conductive pattern 20, and a back surface electrode (for example, a collector electrode) of the semiconductor element 28A is connected to the upper surface of the heat spreader 30A. The heat spreader 30A has an area larger than the semiconductor element 28A mounted thereon. For this reason, heat generated from the semiconductor element 28A is dissipated in the lateral directions by the heat spreader 30A, and is conducted from the heat spreader 30A to the circuit substrate 12 through a wide area. In this way, the heat generated from the semiconductor element 28A can be better discharged to the outside than in a case where the heat spreader 30A is not used. In addition, the heat spreader 30A also functions as a path for the passage of an electric current that is to flow through main electrodes of the semiconductor element 28A.

The specific size of the heat spreader 30A is, for example, approximately 15 mm in length, 15 mm in width, and 1 mm in thickness. A single or multiple semiconductor elements may be mounted on the upper surface of the heat spreader 30A. A metal-oxide-semiconductor field-effect transistor (MOSFET), an insulated gate bipolar transistor (IGBT), a bipolar transistor, or a diode is employed as a semiconductor element mounted on the upper surface of the heat spreader 30A. Incidentally, the heat spreader is sometimes called a heat sink or an R plate.

The hybrid integrated circuit formed on the upper surface of the circuit substrate 12 is sealed by resin. FIG. 1B illustrates the sealing by resin using a case member 22. In FIG. 1B, the sealing by resin is performed by filling the sealing resin 44 into a region surrounded by the frame-like case member 22 with the inner surfaces of the side walls of the case member 22 being in contact with the side faces of the circuit substrate 12. In other words, a circuit element such as the semiconductor element 28A, a metal wire 38, the lead 14 and the conductive pattern 20 are coated with the sealing resin 44. The case member 22 is a frame-like member manufactured by processing a resin material by injection molding, and the sealing resin 44 is formed of a thermosetting resin blended with a filler. In FIG. 1B, a first side wall 24 and a second side wall 26 of the case member 22 are in contact with opposing side surfaces of the circuit substrate 12. Each of the first and second side walls is provided with a recessed portion at its lower end on the inner side, each of the recessed portions having a shape in accordance with the thicknesses of the circuit substrate 12 and an insulating substrate 16.

In another employable configuration for sealing a circuit element and the like formed on the upper surface of the circuit substrate 12, a lid-like case member may be used to cover the upper surface of the circuit substrate 12. Furthermore, the upper, side and lower surfaces of the circuit substrate 12 may be coated with the sealing resin 44 provided by transfer molding.

As shown in FIG. 1C, in this embodiment, the circuit substrate 12 and the insulating substrate 16 are stacked with each other. Firstly, the insulating layer 18 coating the upper surface of the circuit substrate 12 is partially removed so as to provide an exposed portion 40. The circuit substrate 12 exposed from the exposed portion 40 is connected to the conductive pattern 20 through the metal wire 38. Metal wires for the metal wire 38 include a thin metal wire with a diameter of about several tens of μm, and a thick metal wire with a diameter of about several hundreds of μm. The thick metal wire is used for connection of the exposed portion 40 in most cases.

Connecting the circuit substrate 12 with the conductive pattern 20 through the exposed portion 40 as described above makes it possible to adjust the electric potential of the circuit substrate 12 to a fixed electric potential (a ground electric potential or a power source electric potential), and thereby to enhance a shield effect for shielding noise from the outside by using the circuit substrate 12. Moreover, since a part of the conductive pattern 20 and the circuit substrate 12 have the same electric potential, a parasitic capacitance generated therebetween can be reduced. The back surface of the circuit substrate 12 with the above configuration is attached to the upper surface of the insulating substrate 16 with an insulating layer 42 interposed therebetween, the insulating layer 42 made of a silicon resin, a polyimide resin or the like.

The insulating substrate 16 is made of a metal such as aluminum, as is the case with circuit substrate 12, and is formed to be larger in planar size than the circuit substrate 12. Accordingly, an end portion of the insulating substrate 16 and an end portion of the circuit substrate 12 are arranged to be spaced apart from each other. In addition, the upper surface of the insulating substrate 16 is coated with the insulating layer 42 made of a resin material such as a polyimide resin. Moreover, the lower surface of the insulating substrate 16 is flush with the bottom end of the side wall of the case member 22. Both heat dissipation and pressure resistance of the substrates can be achieved at high levels by stacking the circuit substrate 12 and the insulating substrate 16 with each other as described above. Furthermore, even if the insulating substrate 16 is formed to be smaller than the circuit substrate 12, the side surface of the circuit substrate 12 with an exposed metal material can also be insulated from the outside.

Figure 2A:
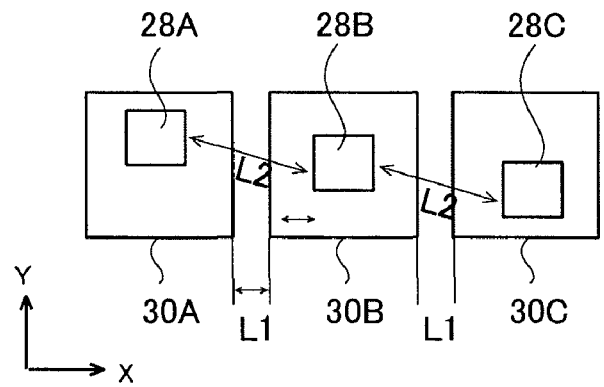
FIGS. 2A to 2C are views for illustrating circuit devices of the present invention.
Figure 2B:
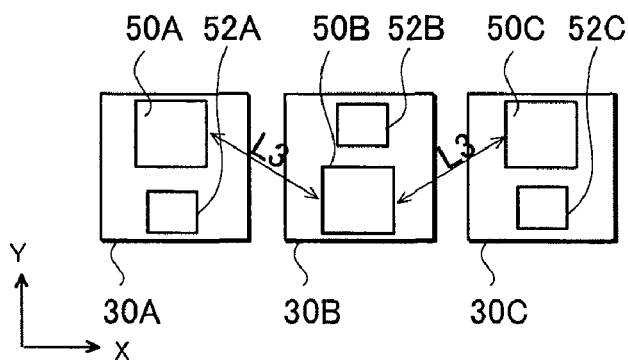
Figure 2C:
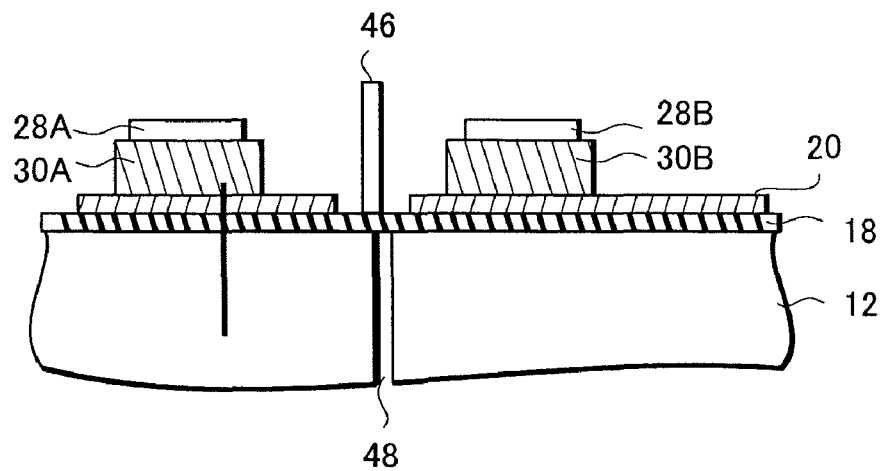

Next, a description will be given of an arrangement of the heat spreader and the semiconductor element, with reference to FIGS. 2A to 2C. FIG. 2A is a plan view for illustrating an arrangement of semiconductor elements 28A and so on; FIG. 2B is a plan view for illustrating another arrangement thereof; and FIG. 2C is a cross-sectional view for illustrating a configuration for suppressing thermal interference.

As shown in FIG. 2A, three heat spreaders 30A, 30B and 30C are arranged close to each other in an X direction, which is the lateral direction on the sheet of FIG. 2A. Although the three heat spreaders 30A, and so on are arranged linearly in the X direction in FIG. 2A, the heat spreaders 30A and so on may be arranged to be slightly shifted from each other. For the purpose of miniaturization of the entire device, the heat spreaders 30A and so on are arranged close to each other, and a distance L1 between the heat spreader 30A and the heat spreader 30B is 2 mm or less, for example. In the case where the heat spreaders 30A and so on are densely arranged as described above, and where the semiconductor elements 28A and so on are arranged at central portions on the upper surfaces of the heat spreaders 30A and so on, the semiconductor elements are arranged so close to each other that overheating may occur due to thermal interference.

For the purpose of suppressing this thermal interference, in this embodiment, the positions at which the semiconductor elements are mounted on the upper surfaces of the heat spreaders are offset from one another. In FIG. 2A, the semiconductor elements are arranged to be shifted from one another in a Y direction, which is perpendicular to the X direction. Specifically, the semiconductor element 28A is arranged near the upper end of the heat spreader 30A; the semiconductor element 28B is arranged around the central portion of the heat spreader 30B; and the semiconductor element 28C is arranged near the lower end of the heat spreader 30C. With this arrangement, the semiconductor elements can be spaced apart from one another, as compared with a case where all the semiconductor elements are arranged at the centers of the heat spreaders. Specifically, a distance L2 between the semiconductor element 28A and the semiconductor element 28B may be set to about 10 mm or more, for example.

In FIG. 2B, an IGBT and a diode are arranged on each of heat spreaders. To be specific, an IGBT 50A and a diode 52A are fixed to the upper surface of a heat spreader 30A; an IGBT 50B and a diode 52B are fixed to the upper surface of a heat spreader 30B; and an IGBT 50C and a diode 52C are fixed to the upper surface of a heat spreader 30C. Having higher calorific power than the diodes, the IGBTs are more likely to thermally interfere with each other during operation.

For the purpose of suppressing thermal interference between the IGBTs, in this embodiment, a positional relation, in the Y direction (in the upward direction on the sheet of FIG. 2B), of the elements mounted on the heat spreader 30B arranged in the middle is reversed to the direction of the elements mounted on the heat spreaders 30A and 30C arranged at both sides of the heat spreader 30B. In other words, on the heat spreader 30A arranged on the left side, the IGBT 50A is mounted near the upper end while the diode 52A is mounted near the lower end. Similarly, on the heat spreader 30C arranged on the right side, the IGBT 50C is mounted near the upper end while the diode 52C is mounted near the lower end. In contrast, on the heat spreader 30B arranged in the middle, the IGBT 50B is mounted near the lower end while the diode 52B is mounted near the upper end. With this arrangement, the IGBTs having high calorific power can be arranged to be spaced apart from each other, and thus thermal interference can be suppressed during operation. A distance L3 between the IGBTs can be set to 10 mm or more, for example.

With reference to FIG. 2C, a description will be given of another configuration for suppressing thermal interference. In this configuration, a wall-like wall portion 46 made of a material with excellent thermal insulation properties is provided between a heat spreader 30A and a heat spreader 30B. The wall portion 46 is made of a material with high thermal insulation properties such as a resin material with no filler, for example. When the wall portion 46 is provided as described above, thermal conductivity and accordingly thermal interference between the adjacent semiconductor elements 28A and 28B can be suppressed.

Moreover, for the purpose of suppressing the thermal interference between the elements, a circuit substrate 12 is partially removed in a groove shape between the heat spreader 30A and the heat spreader 30B and thus a slit 48 is provided. The circuit substrate 12 is made of a material with excellent thermal conductivity such as aluminum. For this reason, when heat is conducted through the circuit substrate 12, thermal interference may occur. To cope with this thermal interference, the slit 48 is provided by partially removing the circuit substrate 12. Accordingly, heat conduction through the circuit substrate 12 is reduced, and thus thermal interference is suppressed.

Figure 3A:
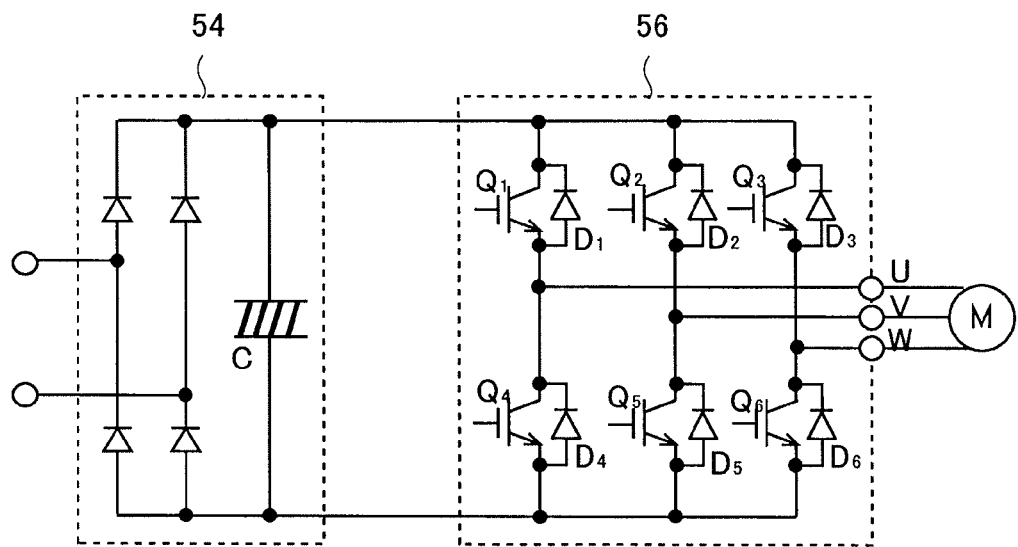
FIG. 3A is a circuit diagram for illustrating an example of a circuit incorporated in a circuit device of the present invention.
Figure 3B:
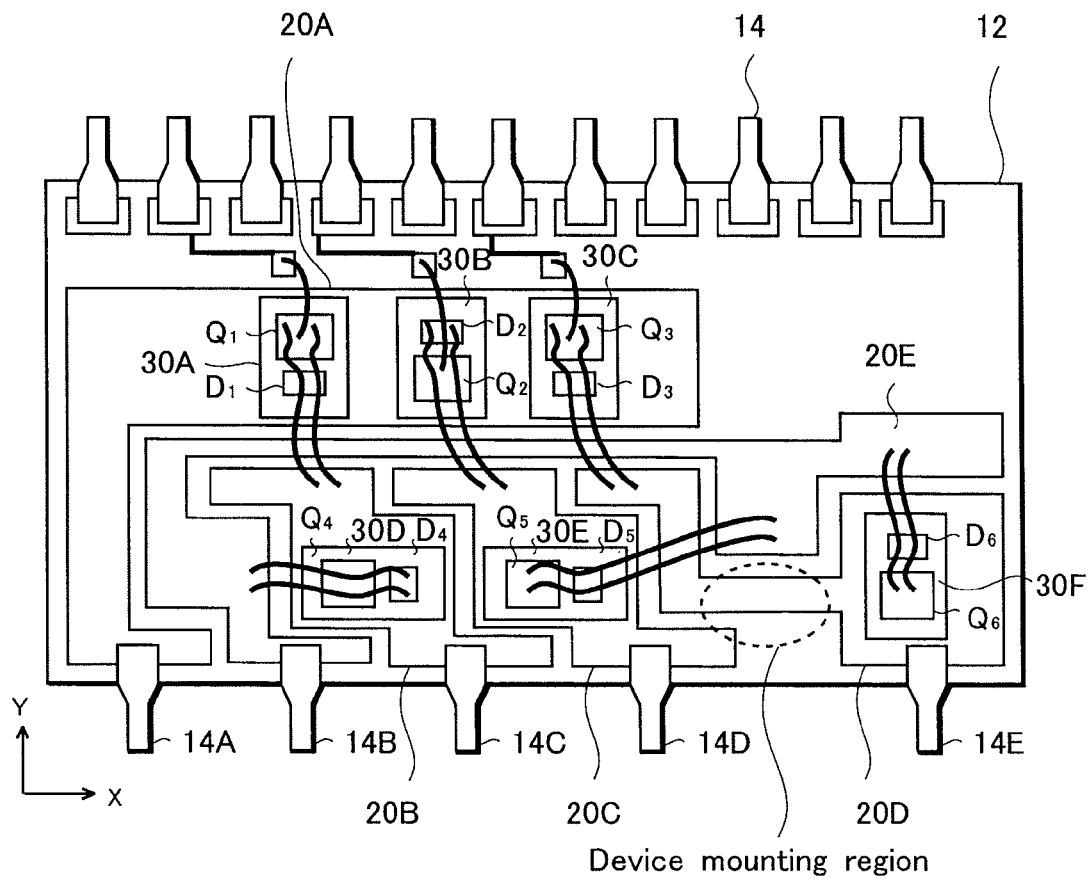
FIG. 3B is a plan view for illustrating the circuit device incorporated with this circuit.

With reference to FIGS. 3A and 3B, a description will be given of a case where an inverter circuit is incorporated in the hybrid integrated circuit device 10 of this embodiment. FIG. 3A is a circuit diagram for illustrating a three-phase inverter circuit; and FIG. 3B is a plan view for schematically illustrating a circuit substrate 12 incorporating the inverter circuit.

FIG. 3A illustrates, as an example of an electrical circuit formed on the upper surface of the circuit substrate 12, a rectifier circuit 54 for converting an alternating current power inputted from the outside into a direct current power, and an inverter circuit 56 for converting the direct current power into an alternating current power having a predetermined frequency.

The rectifier circuit 54 is formed of four bridge-connected diodes, and converts an alternating current power inputted from the outside into a direct current power. In addition, the rectifier circuit 54 also includes a capacitor C for stabilizing the converted direct current power. The direct current power after the conversion by the rectifier circuit 54 is outputted to the inverter circuit 56.

The inverter circuit 56 is configured of six IGBTs (Q1 to Q6) and six diodes (D1 to D6). The Q1 to Q3 are high-side transistors, while the Q4 to Q6 are low-side transistors. A collector electrode and an emitter electrode of each of the IGBTs (Q1 to Q6) are connected to a flywheel diode (one of D1 to D6) in an anti-parallel manner. When the flywheel diodes are connected to the IGBTs in the anti-parallel manner in this way, the IGBTs can be protected from a counter electromotive force generated by an inductive load, and thereby prevented from breaking down due to the overvoltage.

In addition, the IGBT (Q1) and the IGBT (Q4) are serially connected to each other and are controlled to be exclusively turned on/off so as to output a U-phase alternating current power from a middle point of both the transistors to the outside through a lead. Moreover, the IGBT (Q2) and the IGBT (Q5) are serially connected to each other and are controlled to be exclusively turned on/off control so as to output a V-phase alternating current power from a middle point of both the transistors to the outside. Similarly, the IGBT (Q3) and the IGBT (Q6) are serially connected to each other and are controlled to be exclusively turned on/off control so as to output a W-phase alternating current power a middle point of both the transistors to the outside. The output of each of the phases is supplied to an excitation coil of a motor M through a lead 14. The switching of the IGBTs is controlled by an unillustrated control element.

As shown in FIG. 3B, the above-mentioned IGBTs and diodes are fixed to the heat spreaders mounted on the upper surface of the conductive pattern. An electric current flows exclusively through either of the IGBT and the diode which are fixed to the same heat spreader. In other words, in the example shown in FIG. 3B, when an electric current flows through the Q1, the electric current does not flow through the D1; and when the electric current flows through the D1, the electric current does not flow through the Q1.

Specifically, three heat spreaders 30A, 30B and 30C are arranged close to each other on a conductive pattern 20A. The IBGT (Q1) and the diode D1 are arranged on the upper surface of the heat spreader 30A; the IBGT (Q2) and the diode D2 are arranged on the upper surface of the heat spreader 30B; and the IBGT (Q3) and the diode D3 are arranged on the upper surface of the heat spreader 30C. In addition, the IBGT (Q1) and the diode D1 are commonly connected to a conductive pattern 20B through metal wires. Moreover, the IBGT (Q2) and the diode D2 are commonly connected to a conductive pattern 20C through metal wires. Furthermore, the IBGT (Q3) and the diode D3 are commonly connected to a conductive pattern 20D through metal wires.

Additionally, a heat spreader 30D, to the upper surface of which the IBGT (Q4) and the diode D4 are fixed, is mounted on the upper surface of the conductive pattern 20B. Further, a heat spreader 30E, to the upper surface of which the IBGT (Q5) and the diode D5 are fixed, is mounted on the upper surface of the conductive pattern 20C. Moreover, a heat spreader 30F, to the upper surface of which the IBGT (Q6) and the diode D6 are fixed, is mounted on the upper surface of the conductive pattern 20D. Furthermore, the elements mounted on the heat spreaders 30D, 30E and 30F are connected to a conductive pattern 20E through metal wires.

In addition, a lead 14A connected to the conductive pattern 20A is on the positive side of the power supply, while a lead 14B connected to the conductive pattern 20E is on the negative side of the power supply. Moreover, the U-phase output is taken from a lead 14C connected to the conductive pattern 20B; the V-phase output is taken from a lead 14D connected to the conductive pattern 20C; and the W-phase output is taken from a lead 14E connected to the conductive pattern 20D.

As shown in FIG. 3B, the heat spreaders 30A, 30B and 30C mounted on the conductive pattern 20A are arranged close to each other. For this reason, the IGBTs (Q1 to Q3) mounted on the upper surfaces thereof may easily cause thermal interference with each other. For the purpose of preventing this thermal interference, in this embodiment, positions on which the IGBTs having relatively high calorific power are mounted on the heat spreaders are offset from one another. To be specific, on the heat spreader 30A arranged on the left side, the IGBT (Q1) is positioned closer to the upper end than the diode D1 is, in FIG. 3B. This also holds true for the heat spreader 30C arranged on the right side. In contrast, in the heat spreader 30B arranged in the middle, a vertical positional relation between the IGBT and the diode is reversed. That is, the IGBT (Q2) is arranged near the lower end, while the diode D2 is arranged near the upper end.

With this configuration, the IGBT (Q1) and the IGBT (Q2) are arranged to be spaced apart from each other. Similarly, the IGBT (Q2) and the IGBT (Q3) are arranged to be spaced apart from each other. This prevents the adjacent IGBTs from thermally interfering with each other.

In addition, as for the heat spreader 30D and the heat spreader 30E, the IGBTs mounted on the upper surfaces are arranged to be spaced apart from each other. In other words, the IGBT (Q4) mounted on the upper surface of the heat spreader 30D is arranged in a position more distant from the heat spreader 30E than the diode D4 is arranged. With this configuration, the IGBT (Q4) and the IGBT (Q5) are spaced apart from each other, and thus thermal interference is suppressed.

Moreover, as for the heat spreader 30E and the heat spreader 30F, these two heat spreaders, themselves, are arranged to be spaced apart from each other, and thus thermal interference is suppressed. Furthermore, a region between these two heat spreaders is a region for arranging a circuit element such as a thermistor. This configuration does not lead to an increase in the total size of a device, even though these two heat spreaders are spaced apart from each other.

Figure 4A:
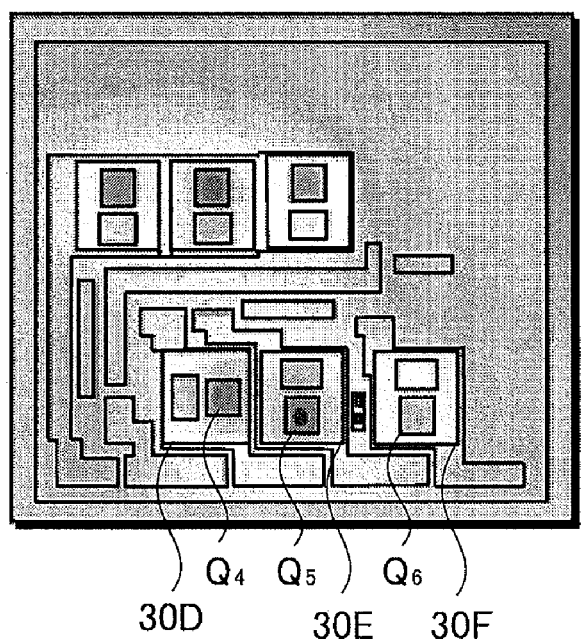
FIGS. 4A and 4B are views for illustrating a result of a heat transfer simulation performed on the circuit device of the present invention.

Next, a description will be given of a result of heat conduction simulation, with reference to FIGS. 4A and 4B. FIG. 4A is a plan view for illustrating the result of the simulation; and FIG. 4B is a cross-sectional view for illustrating the result of the simulation.

As shown in FIG. 4A, a region with high temperature is illustrated in black, while a region with low temperature is illustrated in white. As shown in FIG. 4A, the IGBT (Q4) mounted on the upper surface of the heat spreader 30D and the IGBT (Q5) mounted on the upper surface of the heat spreader 30E are shown in dark black. However, because even the position with the highest temperature has a temperature of 100° C. or less, it is obvious that overheating due to thermal interference is suppressed in the hybrid integrated circuit device of this embodiment.

Figure 4B:
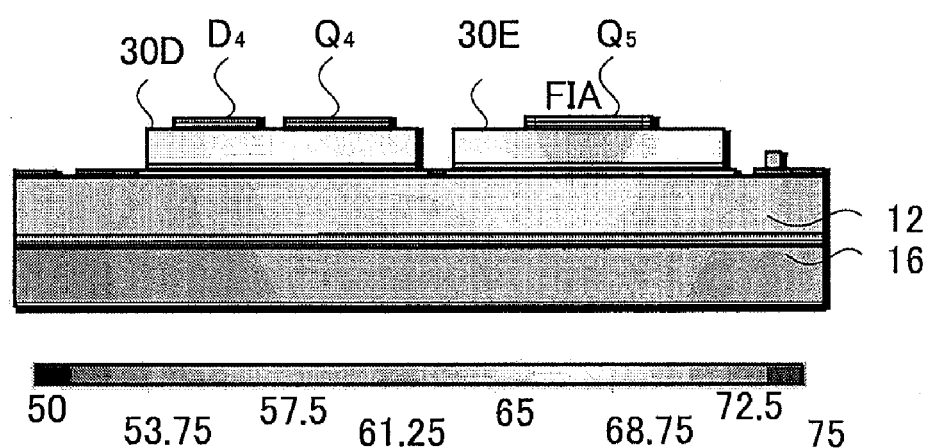
Figure 5:
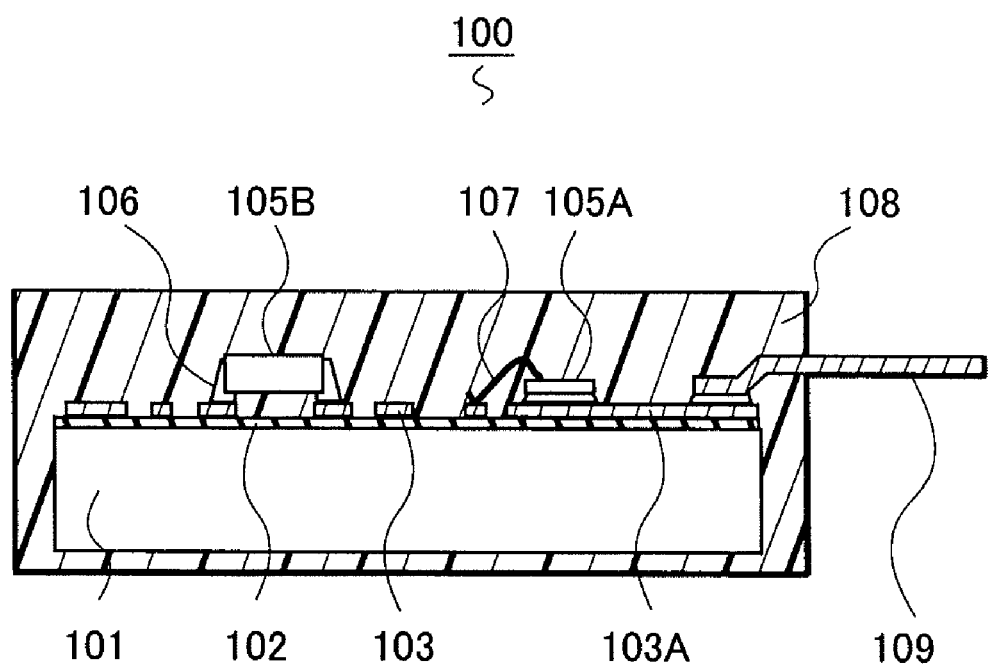
FIG. 5 is a cross-sectional view for illustrating a conventional hybrid integrated circuit device.

As shown in the cross-sectional view of FIG. 4B, a part of the upper surface of the heat spreader 30E on which the IGBT (Q5) is mounted has the highest temperature. The temperature of this part, however, is 100° C. or less, and is within a range having no adverse effect on the operation of the semiconductor element.

From the result of the aforementioned simulation, it is obvious that overheating due to thermal interference between the semiconductor elements is suppressed according to this embodiment.

What is claimed is:

1. A circuit device, comprising:
   a circuit substrate;
   a first heat spreader arranged on an upper surface of the circuit substrate;
   a first semiconductor element fixed to an upper surface of the first heat spreader;
   a second heat spreader arranged, next to the first heat spreader, on the upper surface of the circuit substrate; and
   a second semiconductor element fixed to an upper surface of the second heat spreader; and
   a sealing resin body sealing the first and second heat spreaders and the first and second semiconductor elements,
   wherein, in plan view of the circuit device, the first heat spreader is larger than the first semiconductor element and the second heat spreader is larger than the second semiconductor element,
   in the plan view, a position of the first semiconductor element relative to the first heat spreader is different from a position of the second semiconductor element relative to the second heat spreader, and
   the circuit device is configured to operate as a separated and completed device that includes the first and second semiconductor elements and the first and second heat spreaders.

2. The circuit device according to claim 1, wherein in the plan view, a lateral edge of the first heat spreader and a lateral edge of the second heat spreader lie along a line extending in a first direction, and the first and second semiconductor elements are shifted from each other in a second direction perpendicular to the first direction.

3. The circuit device according to claim 2, wherein the first semiconductor element includes a first transistor and a first diode connected in parallel to the first transistor, the second semiconductor element includes a second transistor and a second diode connected in parallel to the second transistor, the first transistor and the first diode are aligned in the second direction, and the second transistor and the second diode are aligned in the second direction but in a reverse order with respect to the first transistor and the first diode.

4. The circuit device according to claim 3, wherein the first transistor and the second transistor are insulated gate bipolar transistors configured to operate as an inverter circuit.

5. The circuit device according to claim 3, wherein a circuit element is arranged between the first heat spreader and the second heat spreader.

6. The circuit device according to claim 3, further comprising a slit formed in the circuit substrate in a region between the first heat spreader and the second heat spreader.

7. The circuit device according to claim 1, further comprising a third heat spreader arranged, next to the second heat spreader, on the upper surface of the circuit substrate, and a third semiconductor element fixed to an upper surface of the third heat spreader, wherein the first, second and third heat spreaders are aligned in a first direction, and the first, second and third semiconductor elements are shifted from each other in a second direction perpendicular to the first direction.

8. The circuit device according to claim 1, wherein the circuit substrate, the first heat spreader and the first semiconductor element are stacked in this order, and the circuit substrate, the second heat spreader and the second semiconductor element are stacked in this order.

* * * * *